(12) United States Patent
Brener et al.

(10) Patent No.: US 11,749,694 B1
(45) Date of Patent: Sep. 5, 2023

(54) PHOTOCONDUCTIVE METASURFACE-BASED ULTRAFAST DEVICE

(71) Applicants: National Technology & Engineering Solutions of Sandia, LLC, Albuquerque, NM (US); Oleg Mitrofanov, Albuquerque, NM (US)

(72) Inventors: Igal Brener, Albuquerque, NM (US); Polina Vabishchevich, Albuquerque, NM (US); Oleg Mitrofanov, Albuquerque, NM (US)

(73) Assignees: National Technology & Engineering Solutions of Sandia, LLC, Albuquerque, NM (US); UCL Business Ltd, London (GB)

( * ) Notice: Subject to any disclaimer, the term of this patent is extended or adjusted under 35 U.S.C. 154(b) by 373 days.

(21) Appl. No.: 16/943,001

(22) Filed: Jul. 30, 2020

Related U.S. Application Data

(60) Provisional application No. 62/895,257, filed on Sep. 3, 2019.

(51) Int. Cl.
*H01L 27/144* (2006.01)
*G02B 1/00* (2006.01)
*H01Q 9/16* (2006.01)

(52) U.S. Cl.
CPC .......... *H01L 27/1446* (2013.01); *H01Q 9/16* (2013.01)

(58) Field of Classification Search
CPC ... H01L 27/1446; H01Q 9/16; G02F 2203/16; G02F 2203/15; G02F 2203/13; G02B 1/002

See application file for complete search history.

(56) References Cited

U.S. PATENT DOCUMENTS

2017/0063039 A1* 3/2017 Sinclair .................... H01S 5/12

OTHER PUBLICATIONS

Siday et al., Terahertz Detection with Perfectly-Absorbing Photoconductive Metasurface, Apr. 4, 2019, Nano Letters, 19, pp. 2888-2896. (Year: 2019).*
Alaee, R. et al., "Theory of metasurface based perfect absorbers," Journal of Physics D: Applied Physics (2017) 50:503002, 16 pages.
Baranov, D. G. et al., "Coherent perfect absorbers: linear control of light with light," Nature Reviews Materials (2017) 2:17064, 14 pages.

(Continued)

*Primary Examiner* — Sophia T Nguyen
*Assistant Examiner* — John Lin
(74) *Attorney, Agent, or Firm* — Mark A. Dodd; Martin I. Finston

(57) ABSTRACT

A theoretically perfectly absorbing photoconductive all-dielectric metasurface is provided. This metasurface can improve the efficiency and performance of ultrafast photoconductive switches and detectors. In an embodiment, the metasurface is incorporated in photoconductive THz switches or detectors. In embodiments, the metasurface is constituted by a network of gallium arsenide resonators. Each resonator supports two degenerate and critically coupled magnetic dipole modes. Simultaneous excitation of these two modes leads to theoretically close-to-perfect optical absorption near the resonant wavelength.

11 Claims, 11 Drawing Sheets

(56) References Cited

OTHER PUBLICATIONS

Campione, S. et al., "Broken symmetry dielectric resonators for high quality-factor Fano metasurfaces," ACS Photonics (2016) 3(12):2362-2367.
Chong, Y.D. et al., "Coherent Perfect Absorbers: Time-Reversed Lasers," Physical Review Letters (2010) 105:053901, 4 pages.
Cole, M. A. et al., "Strong terahertz absorption in all-dielectric Huygens' metasurfaces," Nanotechnology (2016) 27:424003, 6 pages.
Hsu, C. W. et al., "Bound states in the continuum," Nature Reviews Materials (2016) 1:16048, 14 pages.
Kats, M. A. et al., "Optical absorbers based on strong interference in ultra-thin films," Laser Photonics Rev. (2016) 10 (5):735-749.
Koshelev, K. et al., "Assymetric Metasurfaces with High-Q Resonances Governed by Bound States in the Continuum," Physical Review Letters (2018) 121:193903, 6 pages.
Kuznetsov, A. I. et al., "Magnetic light," Scientific Reports (2012) 2:492, 6 pages.
Limonov, M. F. et al., "Fano resonances in photonics," Nature Photonics (2017) 11:543-554.
Liu, S. et al., "Light-Emitting Metasurfaces: Simultaneous Control of Spontaneous Emission and Far-Field Radiation," Nano Letters (2018) 18:6906-6914.
Ming, X. et al., "Degenerate critical coupling in all-dielectric metasurface absorbers," Optics Express (2017) 25 (20):24658-24669.
Mitrofanov, O. et al, "Near-field microscope probe for far infrared time domain measurements," Applied Physics Letters (2000) 77(4):591-593.
Mitrofanov, O. et al., "Collection-Mode Near-Field Imaging with 0.5-THz Pulses," IEEE Journal on Selected Topics in Quantum Electronics (2001) 7(4):600-607.
Mitrofanov, O. et al., "Efficient photoconductive terahertz detector with all-dielectric optical metasurface," APL Photonics (2018) 3:051703, 6 pages.
Piper, J. R. et al., "Total absorption by degenerate critical coupling," Applied Physics Letters (2014) 104:251110, 4 pages.
Vabishchevic, P. P. et al., "Enhanced Second-Harmonic Generation Using Broken Symmetry III-V Semiconductor Fano Metasurfaces," ACS Photonics (2018) 5:1685-1690.
Volatier, M. et al., "Extremely high aspect ration GaAs and GaAs/AlGaAs nanowaveguides fabricated using chlorine ICP etching with $N_2$-promoted passivation," Nanotechnology (2010) 12:134014, 8 pages.
Wan, W. et al., "Time-Reversed Lasing and Interferometric Control of Absorption," Science (2011) 331:889-892.
Xu, X. et al., "Enhanced Photoresponse in Metasurface-Integrated Organic Photodetectors," Nano Letters (2018) 18:3362-3367.
Zhou, H. et al., "Perfect single-sided radiation and absorption without mirrors," Optica (2016) 3(10):1079-1086.

* cited by examiner

PHOTOCONDUCTIVE METASURFACE-BASED ULTRAFAST DEVICE

CROSS-REFERENCE TO RELATED APPLICATION

This application claims priority to U.S. Provisional Application No. 62/895,257, filed on Sep. 3, 2019 and titled Photoconductive Metasurface-Based Ultrafast Device, the entirety of which is hereby incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention

FIELD OF THE INVENTION

The present invention relates to detectors and switches that are responsive to electromagnetic radiation up to the terahertz range of frequency, and more particularly to those devices that are enhanced by the use of metamaterials.

Art Background

The speed of wireless communications and data processing is advancing into the terahertz (THz) range. As a consequence, there is a need for devices to generate, detect, and modulate terahertz signals with greater efficiency than is currently available.

One important technology that is useful in this regard is the ultrafast photoconductive (PC) switch. The PC switch is an optoelectronic element that, under illumination, can go from an electrical conductivity state characterized by high resistivity to a state characterized by high conductivity (ON) in a switching time as short a one picosecond or even less.

Efficient PC switching is a consequence of three factors: a short recombination time for photoexcited charge carriers, preferably less than one picosecond; high conductivity contrast between the ON and OFF states; and high efficiency for converting photons to charge carriers. These three factors would all be present together in an optimum material for producing an efficient PC switch or detector. However, the search for such a material has met with difficulty.

Materials with sub-picosecond recombination times have been achieved, even in high-conductivity-contrast materials. Successful approaches involve incorporating charge-trapping centers in the materials through advanced growth techniques and post-growth treatment.

However, materials that also exhibit high conversion efficiency have been elusive. One fundamental difficulty is that in order to absorb the maximum number of photons, the PC material needs a relatively high optical thicknesses. The greater the thickness, however, the greater the fraction of photoexcited charge carriers that recombine before they can drift across the PC layer.

Recently, researchers have introduced plasmonic nanostructures to the PC switch architecture in efforts to improve the conversion efficiency. Plasmonic nanostructures can potentially enhance the photoexcitation of charge carriers through optical field concentration close to the electrodes, and through photon trapping. However, the use of plasmonic nanostructures can also reduce the conductivity contrast, and it can introduce ohmic losses. Both of these factors tend to reduce device performance.

For the above reasons, there is a need for new PC switch architectures that can improve the conversion efficiency without the drawbacks of known plasmonic structures.

SUMMARY OF THE INVENTION

We have provided a new PC device architecture that includes an all-dielectric metasurface that efficiently absorbs light while concurrently forming an electrically connected network. Under optical excitation, the resulting device can switch rapidly between OFF and ON conductivity states with high contrast.

An important feature of our new device is that high optical absorption is achieved because of engineered resonance effects in the metasurface, even though the metasurface is optically thin.

In this regard, a film is "optically thin" at a given wavelength if, absent the engineered resonance effects, the thickness of the film would be less than one absorption depth.

Conventionally, high absorption is achieved in optically thin metasurfaces by adding a metallic back-reflector. A metallic back-reflector is omitted from our design, however, because it would block terahertz radiation.

Instead, we apply a principle that was recently reported in the scientific literature: An all-dielectric metasurface can theoretically be perfectly absorbing at a resonant frequency if it supports two critically coupled, degenerate, resonant modes of respective odd and even symmetries relative to the metasurface plane. This principle is discussed, for example, in X. Ming et al., "Degenerate Critical Coupling in All-Dielectric Metasurface Absorbers," *Opt. Express* 2017, 25 (20), 24658, and in J. R. Piper et al., "Total Absorption by Degenerate Critical Coupling," *Appl. Phys. Lett.* 2014, 104 (25), 251110, both of which are hereby incorporated herein, in entirety, by reference.

In a practical implementation, the metasurface was constituted by an array of cubic Mie resonators. (In this regard, a "Mie resonator" is a dielectric body that exhibits morphology-dependent optical resonances. In examples of greatest current interest, these resonances include electrical and magnetic dipole modes.) The symmetry of the cubic resonators was broken by adding a continuous bar that extended along one side of each resonator. Concurrently, the bar provided a path for photoexcited charge carriers to flow along the metasurface, in the direction (referred to here as the "y-direction") parallel to the electrical polarization direction of a linearly polarized, normally incident, plane wave.

Even with perfect cubic symmetry, the incident wave would couple to the fundamental $M_x$ magnetic dipole mode of the resonators. However, the breaking of symmetry was needed so that the incident wave would also couple efficiently to the fundamental $M_z$ magnetic dipole mode.

In our practical implementation, we fabricated the PC metasurface from low temperature gallium arsenide (LT-GaAs). The recombination time for charge carriers photogenerated in this material (by interband electron excitation at 800 nm) is shorter than one picosecond.

By suitably designing the resonator network, we were able to obtain a contrast in conductivity of over $10^7$ between the ON and OFF states.

We integrated the metasurface with a terahertz antenna to make a detector able to detect terahertz pulses with more than six orders of magnitude signal-to-noise ratio (SNR), using ultrafast laser excitation with an optical power as low as 100 μW. We found that the switching time was short enough to enable detection up to a frequency of 3 THz.

Accordingly, the invention relates to an apparatus for providing a photoconductive response to optical excitation. The apparatus comprises an all-dielectric metasurface disposed on a substrate surface and an electrode arrangement electrically connected to the all-dielectric metasurface. The all-dielectric metasurface comprises an array of dielectric Mie resonators. The array of resonators incorporates interconnecting features. These features collectively interconnect the Mie resonators in a network that carries electric current when in operation and have a configuration that prevents the Mie resonators in which they are incorporated from having more one symmetry plane normal to the substrate surface.

In embodiments, the interconnecting features are bars that connect pluralities of the Mie resonators in rows.

In embodiments, the electrode arrangement comprises a terahertz antenna which may for example be constituted by two metal bars in a dipole configuration.

In embodiments, the metasurface has a composition comprising gallium arsenide. For example, an epitaxial layer of gallium arsenide may be grown on a gallium arsenide substrate.

In embodiments, each of the Mie resonators is conformed to support, when excited at a resonant optical frequency, two magnetic dipole modes that are degenerate in frequency, or, in other embodiments, two optical modes that are degenerate in frequency and that are opposite in symmetry.

In embodiments, the metasurface is optically thin and is not underlain by any metallic structures.

In embodiments, the apparatus is conformed as a switch. In other embodiments, the apparatus is conformed as an optical detector.

Figure 1A:
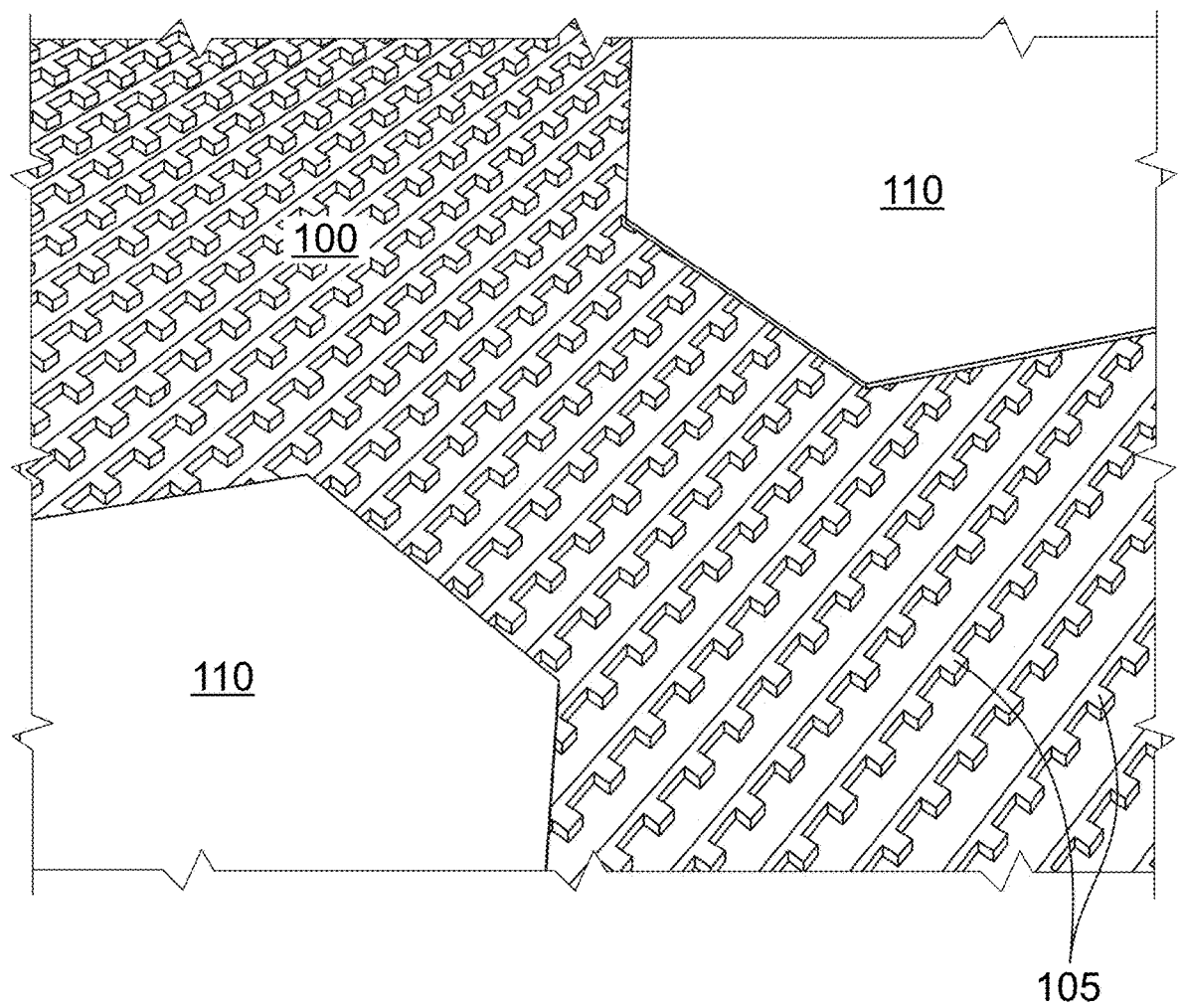
FIG. 1A is a notional cartoon drawing of a photoconductive metasurface according to an embodiment of the present invention. As seen in the drawing, a network of resonators with broken symmetry is integrated into a THz detector. A terahertz (THz) dipole antenna is also included in the device of FIG. 1A. The tips 110 of the dipole antenna are also shown in the drawing.
Figure 1B:
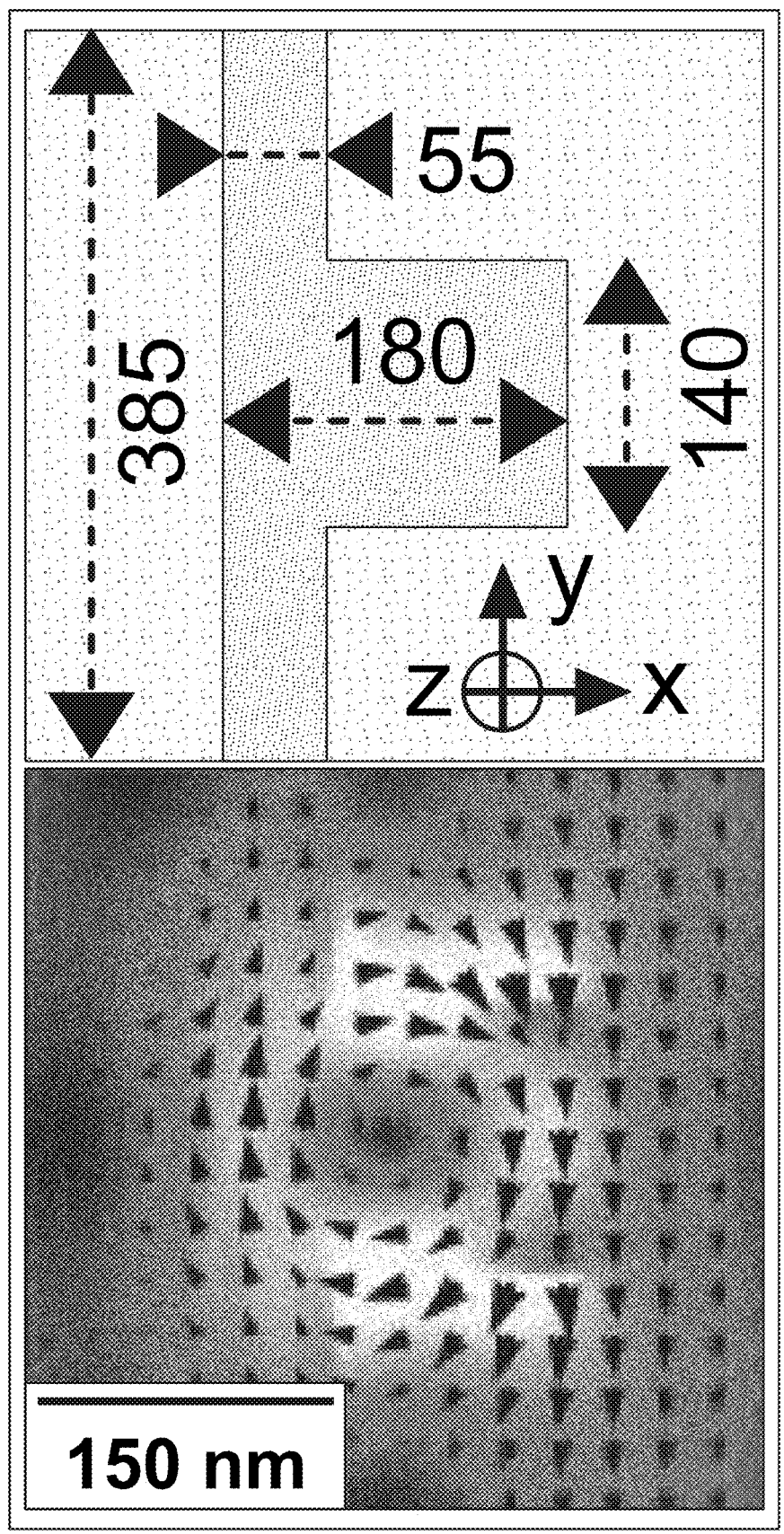
FIG. 1B is a representation of an individual dielectric Mie resonator with broken symmetry, according to an embodiment of the present invention. The top view is a schematic drawing of the resonator, with dimensions indicated in units of nanometers. The dimensions are for a GaAs resonator (n=3.6) surrounded by a uniform low-index medium (n=1.57), wherein perfect absorption is theoretically achieved at 800 nm.

The bottom view of FIG. 1B is a simulated electric field distribution in the xy-plane at middle height in the resonator, showing the distinctive circulating electric field of the MD mode $M_z$ under excitation with a y-polarized plane wave at normal incidence.

Figure 1C:
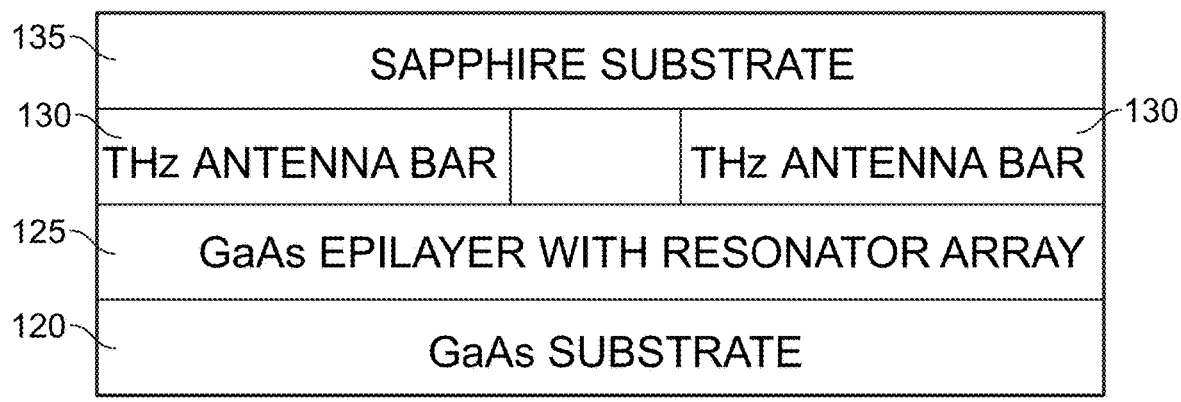

FIG. 1C is a notional cross-section, not drawn to scale, illustrating a possible layer structure in an example device of the kind illustrated in the preceding figures.

Figure 1D:
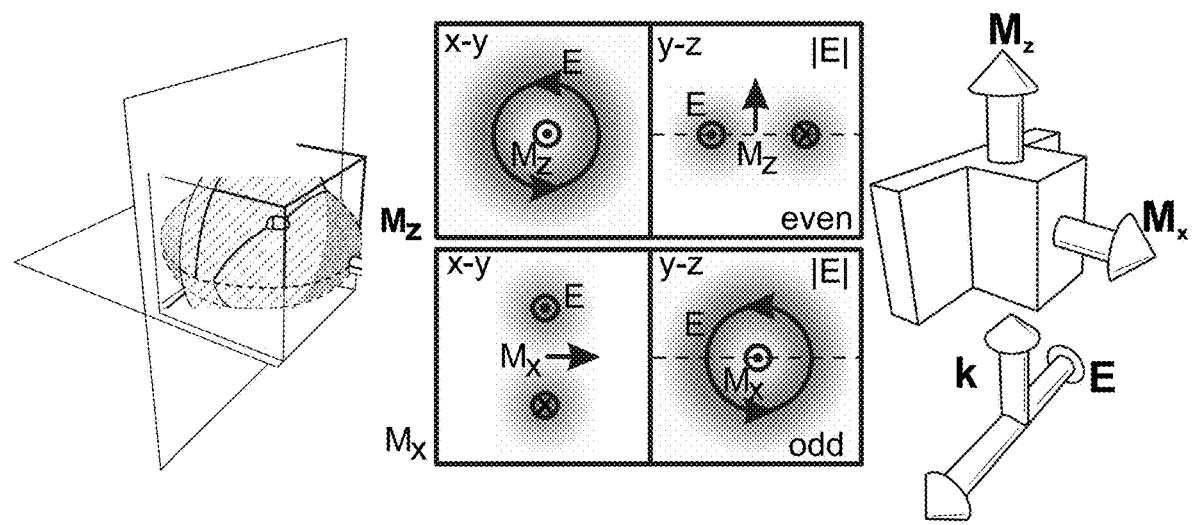

FIG. 1D is a notional representation of certain Mie resonances in a cubic resonator. The far left view illustrates the magnetic dipole (MD) Mie modes $M_x$ and $M_z$. The center view illustrates the corresponding electric field distributions in the xy- and yz-planes. It should be noted that the spatial distribution of the electric field component $E_y$ is even with respect to the xy-plane for $M_z$, $E_y(z)=E_y(-z)$, and odd for $M_x$, $E_y(z)=-E_y(-z)$.

A y-polarized plane wave propagating in the z-direction is illustrated in the far right panel, as will be understood from the orientation of the propagation vector k and the orientation of the electric field vector E shown in the figure. The MD mode $M_x$ can be excited by a y-polarized plane wave propagating in the z-direction, whereas the MD mode $M_z$ is dark for the light at normal incidence. In contrast, the two modes can be excited by a y-polarized wave propagating in the z-direction in a cubic resonator with broken symmetry, for example, with a bar attached to one side, as shown in the figure.

Figure 2A:
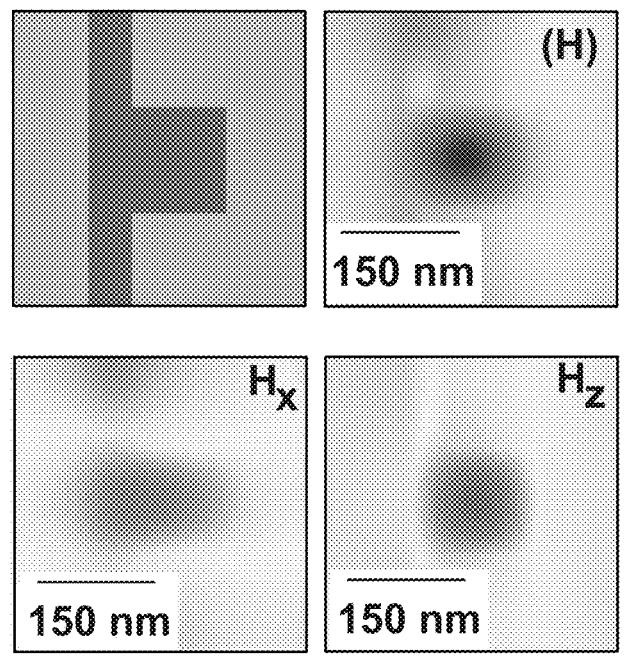

FIG. 2A shows the simulated magnetic field distribution in a resonator with symmetry broken by a bar. Two components $H_x$ and $H_z$ of similar magnitude are seen in the figure. These correspond respectively to the MD modes $M_x$ and $M_z$. The field maps are shown in the xy-plane at the midpoint of the resonator.

Figure 2B:
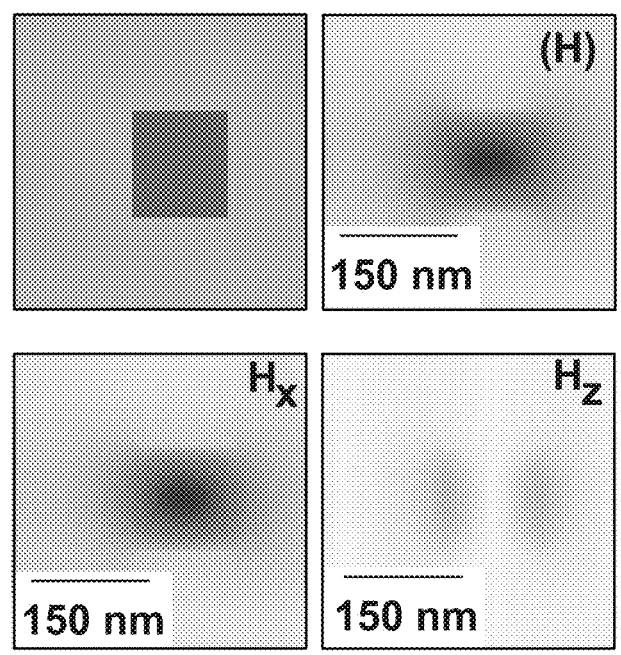

FIG. 2B shows the simulated magnetic field distribution in a rectangular resonator in which symmetry has been maintained. As seen in the figure, the resonator exhibits only the MD mode $M_x$ for the same excitation conditions as in the preceding figure.

Figure 2C:
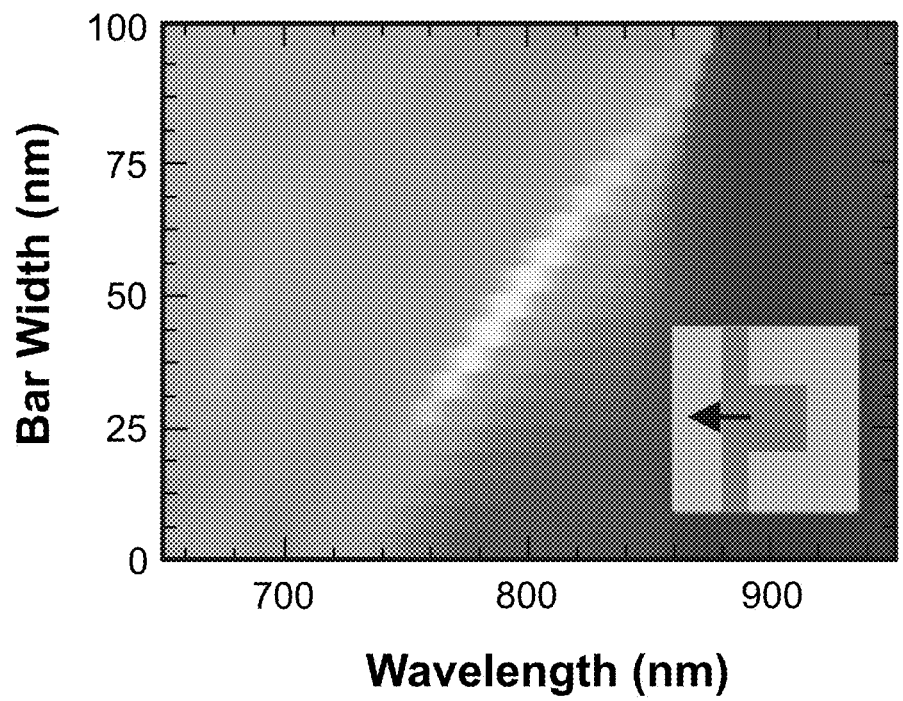

FIG. 2C is a grey scale rendering of a color map of simulated optical absorption in resonators with asymmetric shapes, as the exciting wavelength is varied and as the width of the symmetry-breaking bar is varied.

Figure 2D:
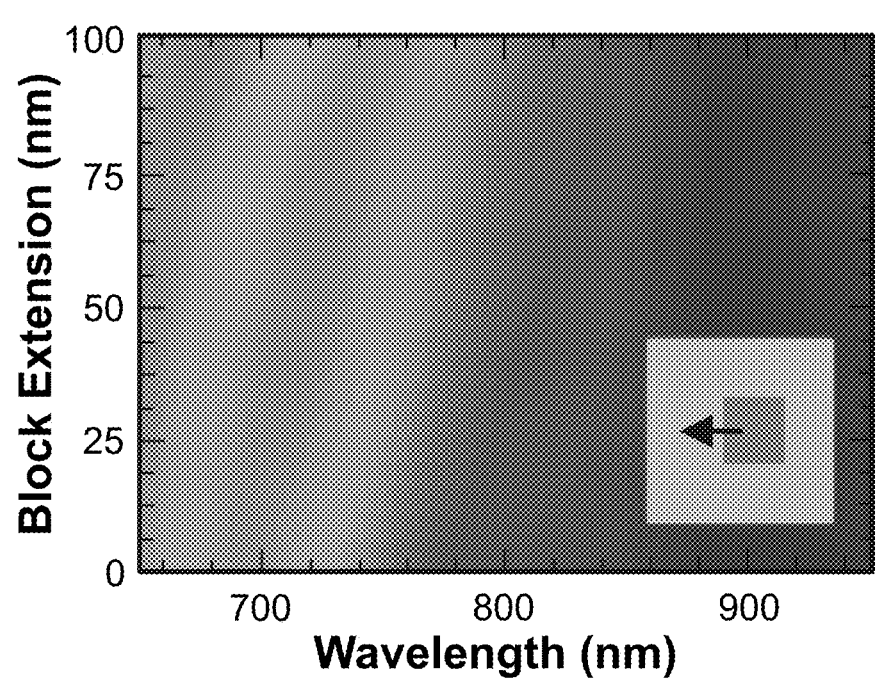

FIG. 2D is a grey scale rendering of a color map of simulated optical absorption in resonators with asymmetric shapes, as the exciting wavelength is varied and as the width of the rectangular extension (i.e., of the bar) is varied. It will be seen that the asymmetric design exhibits a strong absorption band, which shifts from 750 nm to 850 nm as the width of the bar is increased; perfect absorption is achieved near 800 nm.

Figure 3A:
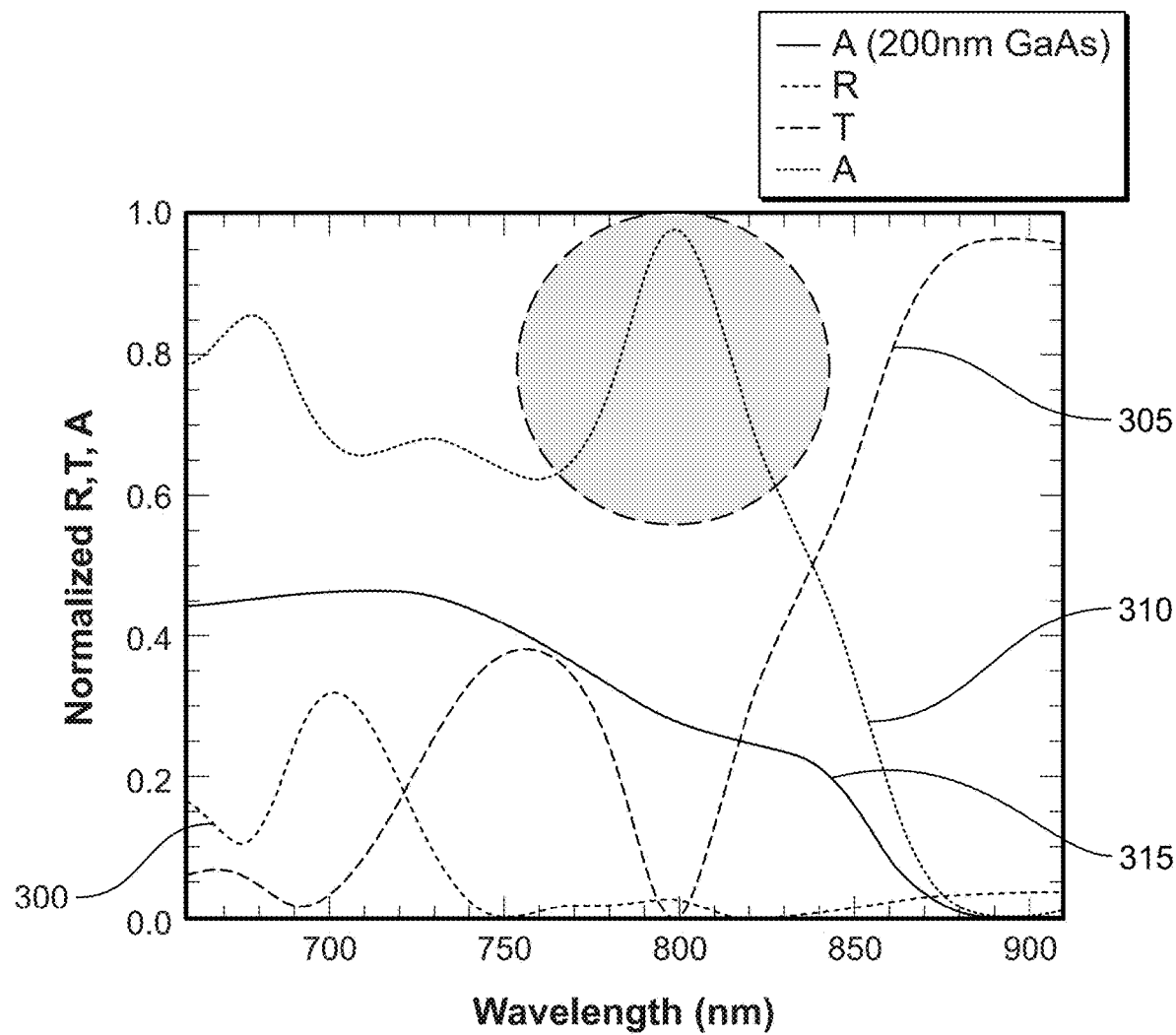
Figure 3B:
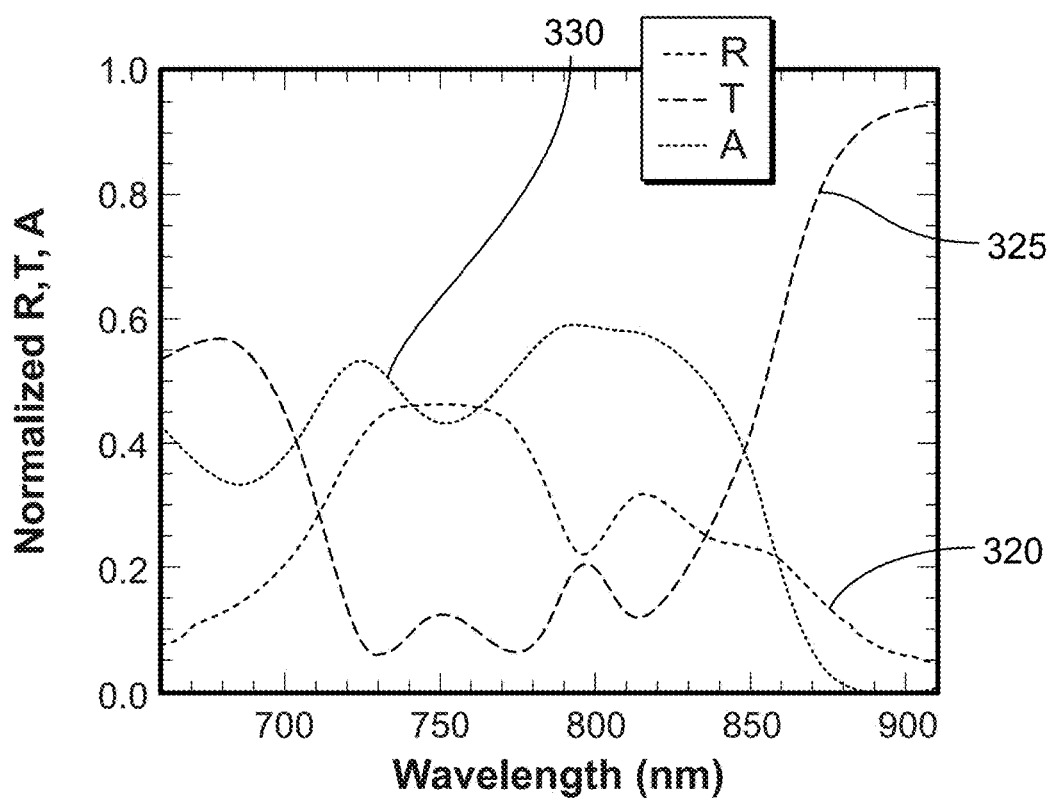

FIGS. 3A and 3B are plots of the simulated absorption, reflectivity, and transmission spectra for a metasurface made of 200-nm-thick GaAs. FIG. 3A is for y-polarized light at normal incidence, and FIG. 3B is for x-polarized light.

FIG. 3A includes a comparative plot of the optical absorption in an unstructured 200-nm-thick layer of GaAs. As seen in the figure, an absorption peak at 800 nm, which is highlighted in the figure, rises above the absorption spectrum of the unstructured layer. The peak corresponds to the MD mode $M_z$.

For the x-polarized excitation of FIG. 3B, the incident wave excites the MD mode $M_y$, whereas $M_z$ remains unexcited. As seen in the figure, absorption at 800 nm is significantly lower than in the preceding figure.

Figure 4A:
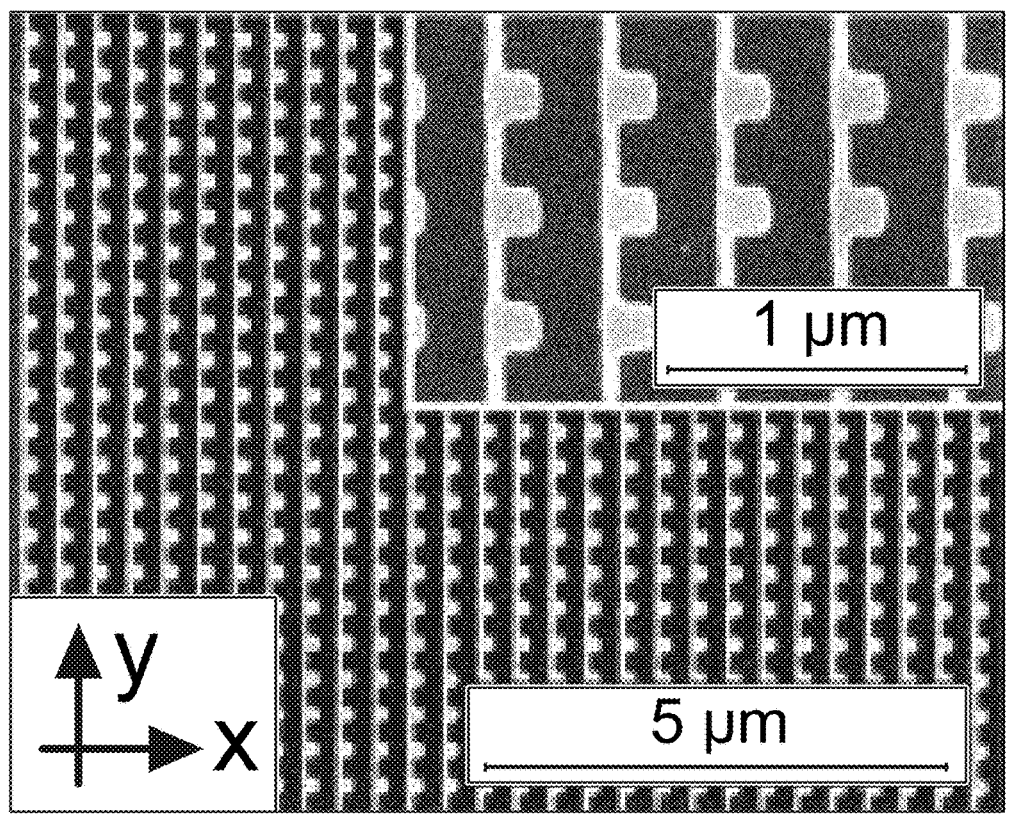

FIG. 4A is a rendering from a scanning electron micrograph of a fabricated metasurface with individual resonators. The inset is a portion of the main image, shown at greater magnification.

Figure 4B:
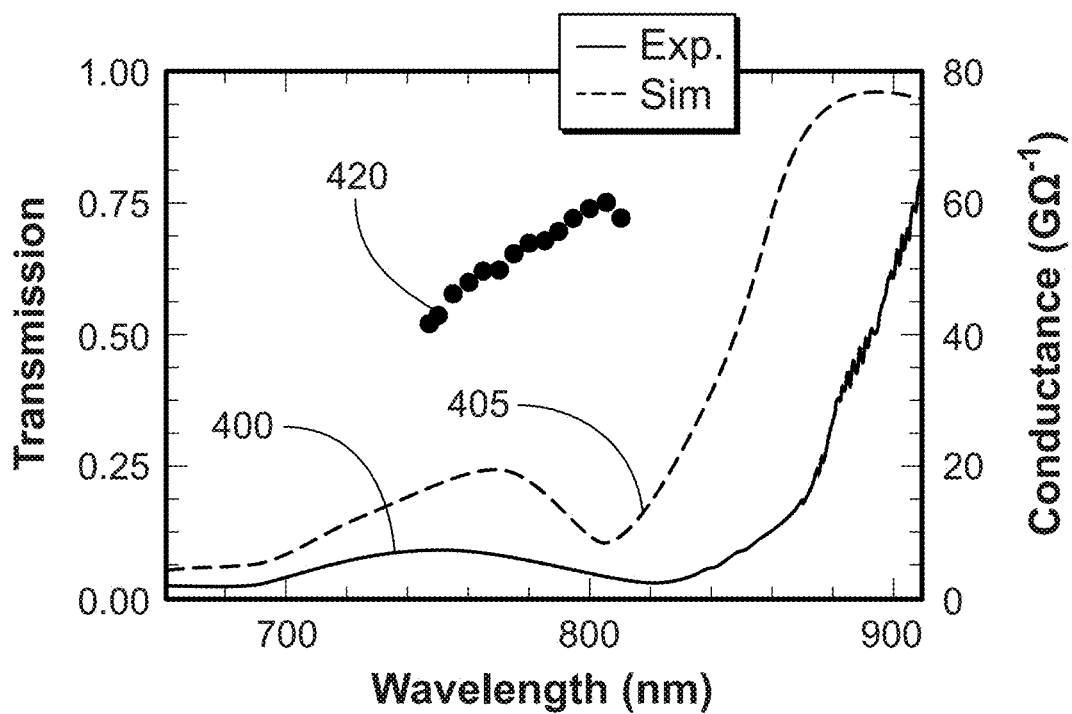
Figure 4C:
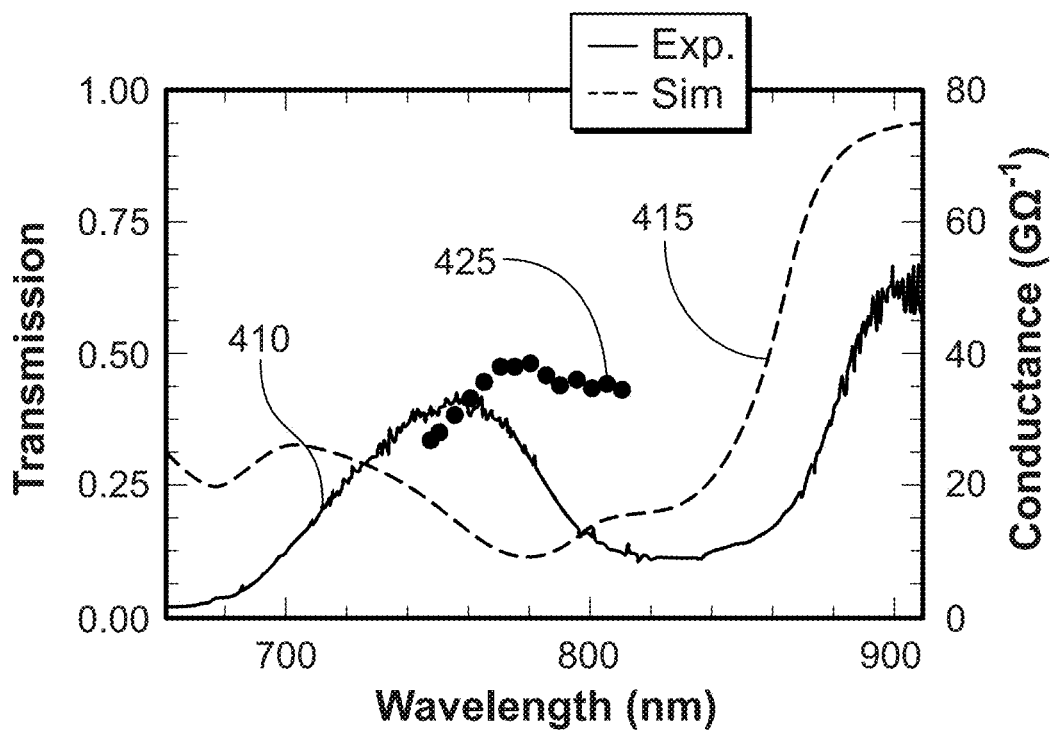

FIGS. 4B and 4C are plots of transmission and photoconductivity spectra for, respectively, y-polarized and x-polarized light incident on a metasurface. In each figure, the transmission spectrum represents transmission averaged over the beam spot area, which is similar in size to the area shown in the preceding figure. For comparison, dashed lines show numerically simulated transmission spectra for focused beam illumination, which can excite n directly. Data points plotted as a series of dots show a photoconductivity spectrum of the metasurface measured using ultrafast laser excitation (~150 fs, 200 μW average power) focused between electrical contacts separated by 3 μm.

Figure 4D:
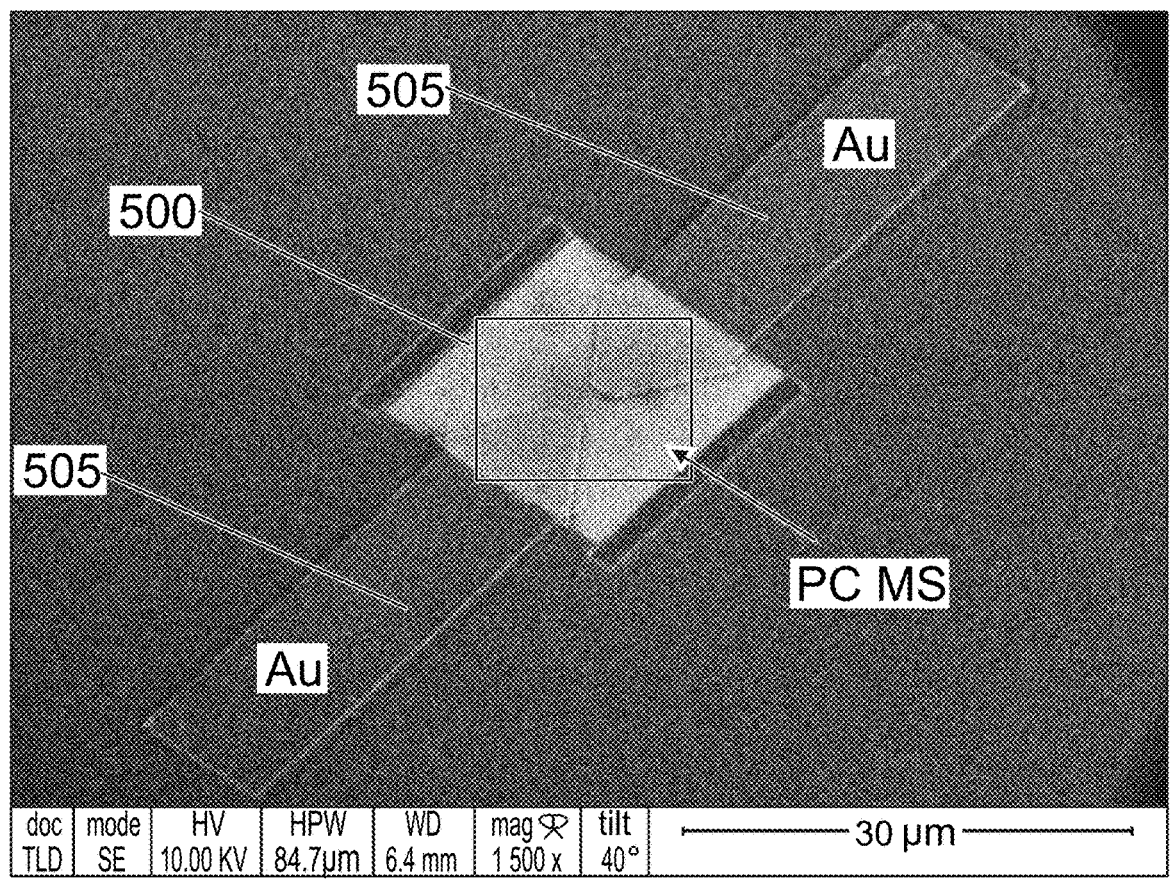

FIG. 4D is a rendering from a scanning electron microscope (SEM) image of a terahertz antenna that was fabricated on top of a metasurface of the kind described here. The labels "Au" mark the antenna arms, which were fabricated of gold. The label "PC MS" marks the photoconducting metasurface. The dashed rectangle outlines the photoconductive area of the antenna.

FIGS. 5A-5D illustrate characteristics of a photoconductive THz detector with an integrated, theoretically perfectly absorbing metasurface.

Figure 5A:
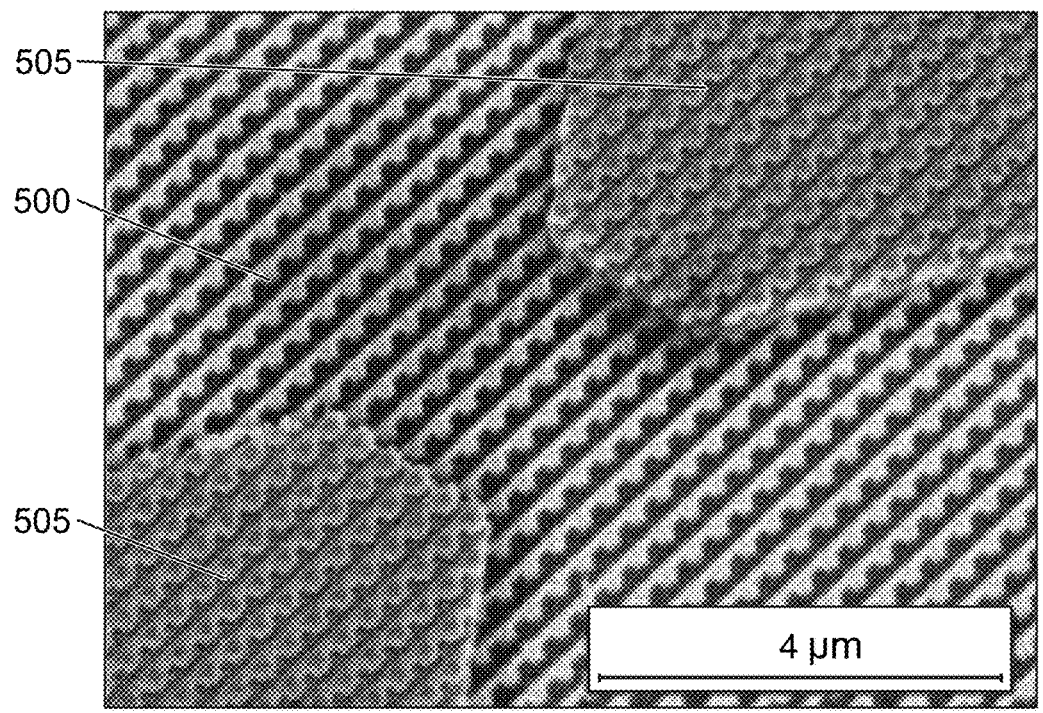

FIG. 5A is a rendering from a scanning electron microscope (SEM) image of the photoconductive area of a fabricated photoconductive terahertz detector. Included in the view of the figure are the tips of the terahertz antenna. These tips also serve as the electrical contacts to the metasurface.

Figure 5B:
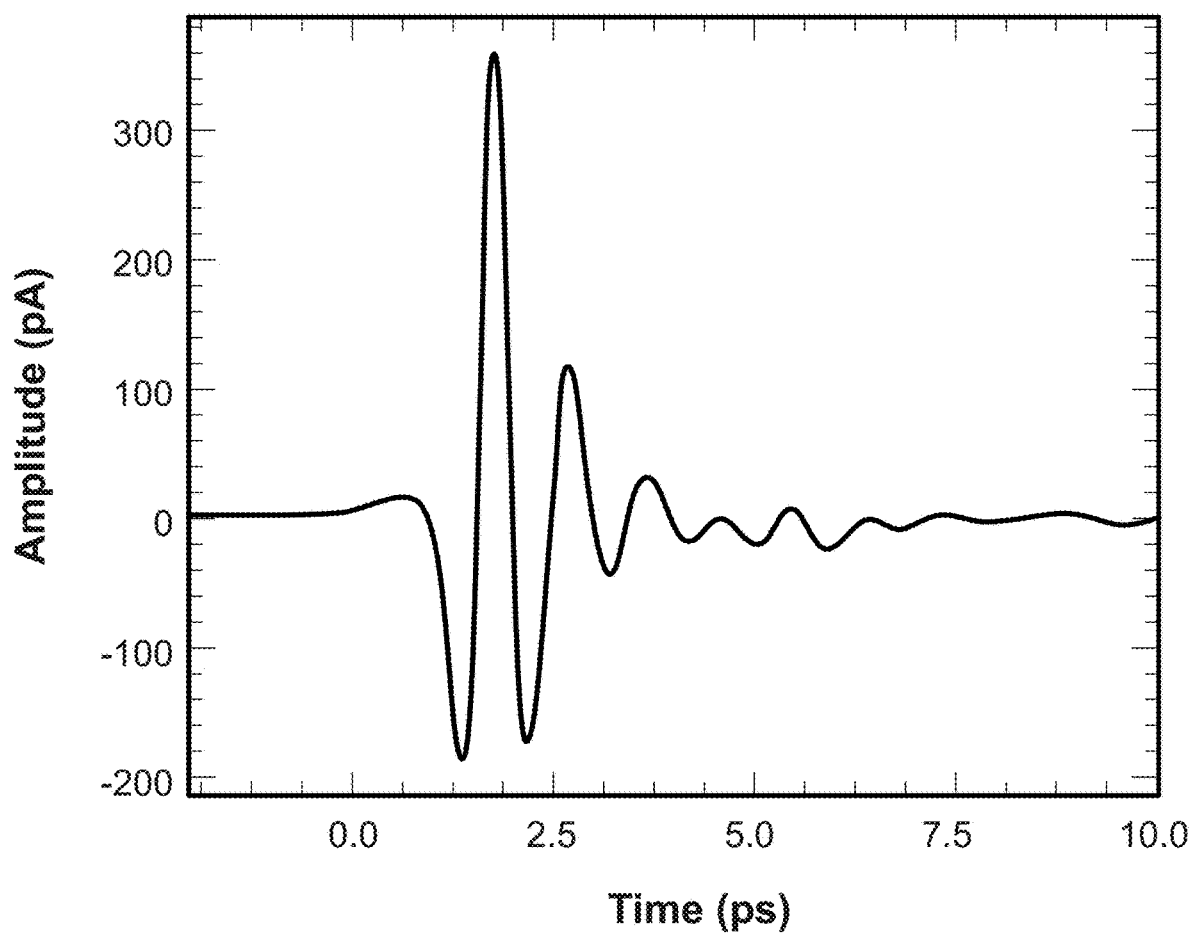

FIG. 5B is a graph of a terahertz pulse waveform measured with the detector of the preceding figure, using y-polarized optical gating pulses of average power 100 μW.

Figure 5C:
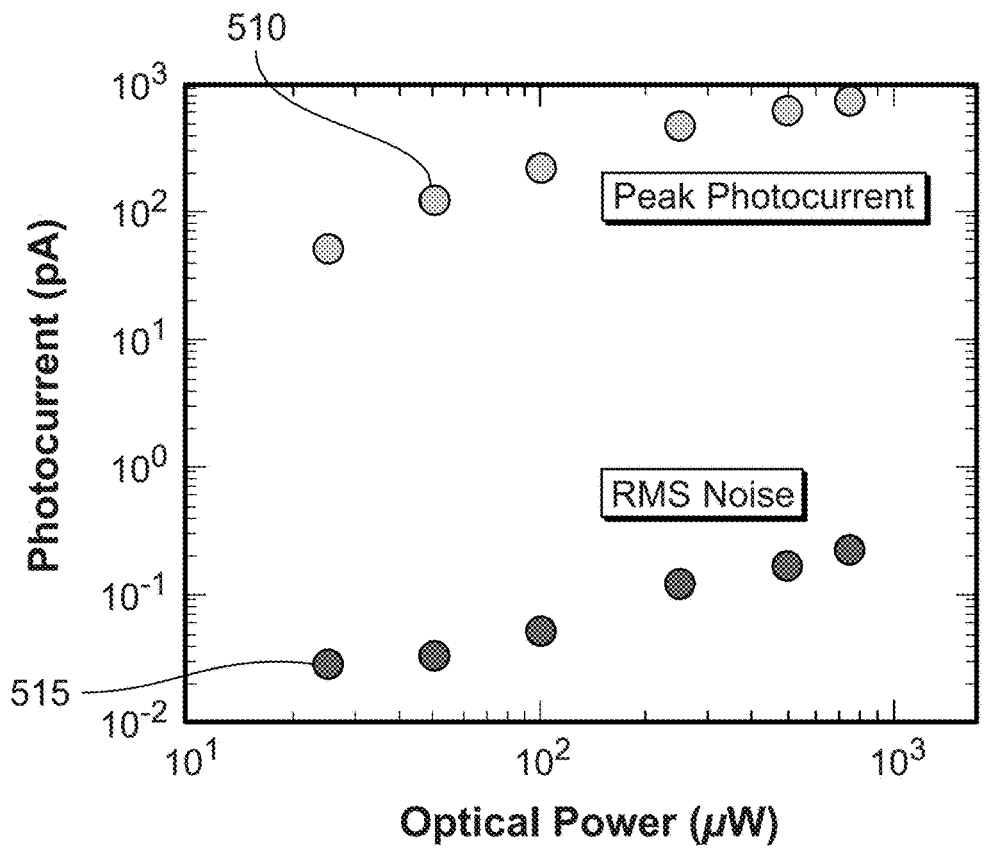

FIG. 5C is a graph of photocurrent measured on the detector of the preceding figures. The upper plot shows the peak THz photocurrent, and the lower plot shows the RMS noise, as functions of average power of an optical gate beam.

Figure 5D:
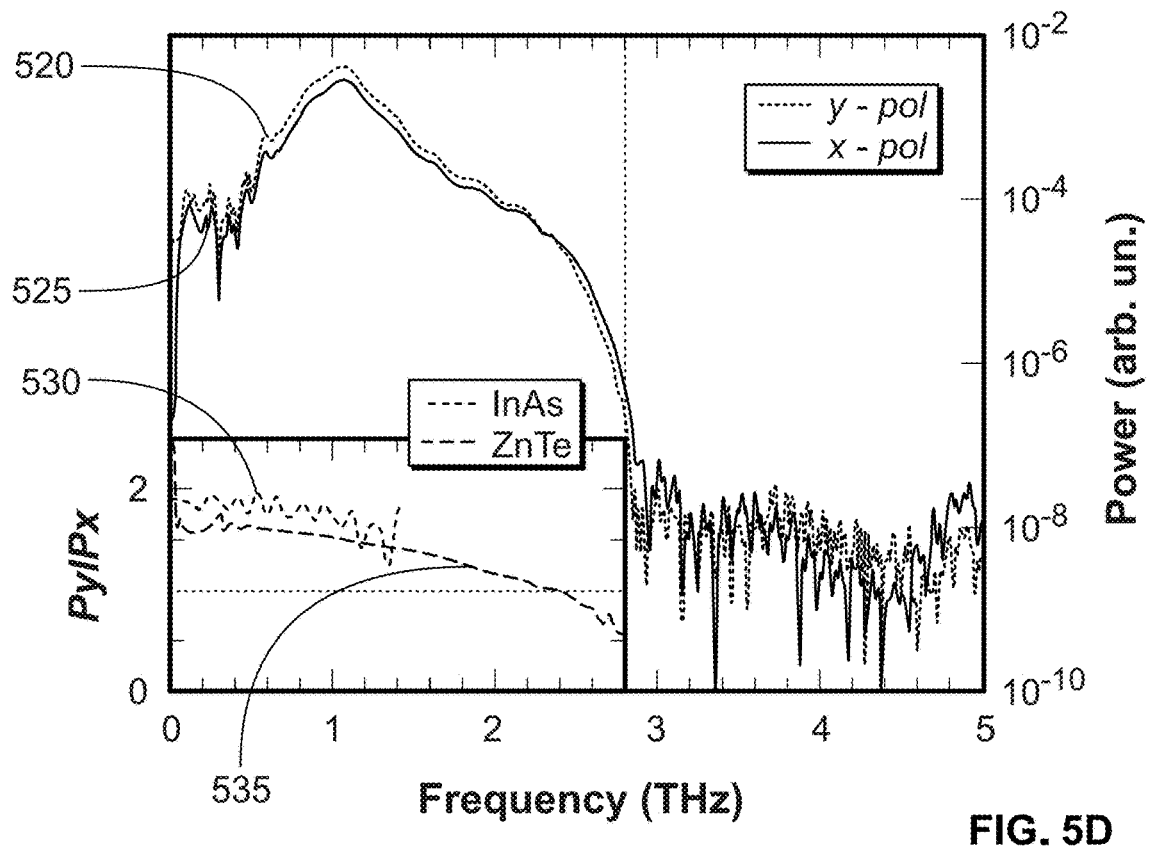

FIG. 5D shows (main figure) a power spectral density (PSD) spectrum obtained by Fourier transform of terahertz pulse waveforms detected using the detector of the preceding figures. Two orthogonal polarizations of the optical gating pulses are represented. The inset in the figure shows the PSD ratio for the two polarizations (y-polarized/x-polarized) for frequencies up to 2.9 THz, above which SNR <10. We confirmed that the PSD ratio is independent of the incident THz pulse waveform by using different THz pulses generated using InAs and ZnTe crystals.

DETAILED DESCRIPTION

FIG. 1A is a notional cartoon drawing of a photoconductive metasurface according to an embodiment of the present invention. As seen in the drawing, an arrayed network 100 of dielectric Mie resonators 105 with broken symmetry is integrated into a THz detector. The detector also includes a terahertz (THz) dipole antenna. Only the tips 110 of the dipole antenna are shown in the figure.

The top part of FIG. 1B is a representation of an individual dielectric Mie resonator of the device of the preceding figure. Example dimensions are indicated on the figure in units of nanometers. These dimensions were devised for a gallium arsenide (GaAs) with a refractive index n of 3.6, surrounded by a uniform low-index medium (n=1.57). Simulations showed that such a resonator could achieve theoretically perfect absorption at an exciting wavelength of 800 nm.

As shown in the figure, the example resonator consists of a rectangle of dimensions 180 nm×140 nm, merged with a bar of dimensions 55 nm×385 nm. By "merged" is meant that a portion of the rectangle is coextensive with the bar. The bar interconnects the resonator with similar bars on neighboring resonators so that, for example, pluralities of the Mie resonators can be connected in rows.

Because the bar is on one side only of the rectangle, it breaks the symmetry of the resonator so that there is only one symmetry plane normal to the substrate surface. (With reference to the coordinate system indicated in the figure, the one such symmetry plane would be a plane, normal to the y-axis, that bisects the resonator.) Even less symmetrical configurations could prevent the resonator from having any symmetry plane normal to the substrate surface.

FIG. 1C is a notional cross-section, not drawn to scale, illustrating a possible layer structure in an example device of the kind illustrated in the preceding figures. As shown in the figure, a GaAs substrate 120 provides a growth surface for a GaAs epilayer 125. After the epitaxial growth, the GaAs substrate may be removed in later steps leading to the completion of the device. The antenna bar 130, which will generally be formed of a metal such as gold, is formed on the GaAs epilayer. The resulting device is attached to a substrate 135 for handling. In the example shown, substrate 135 is made of sapphire. Substrate 135 is an example of a substrate onto which the all-dielectric metasurface can be disposed.

It should be borne in mind that GaAs is only one example of a suitable semiconductor for implementing a device of the kind described here. Various alternative semiconductors may also be suitable, provided they have sufficiently low carrier lifetimes. Examples may include radiation damaged silicon and III-V semiconductors that have been modified by radiation damage or by using special growth techniques to limit the carrier lifetime.

To achieve theoretically perfect absorption in our PC metasurface, we sought to design an optical resonator concurrently supporting modes of odd and even symmetry. A nanoscale cube supports a set of resonant Mie modes, wherein the lowest frequency mode is the magnetic dipole (MD) mode. Because of the cubic symmetry, there are three degenerate MD modes, which we identify, below, according to the respective direction of the magnetic dipole vector M.

Two of the modes, $M_x$ and $M_y$, have their dipole moments in the xy-plane with the spatial distribution of the corresponding electric field component $E_y$ being odd with respect to the metasurface plane. The dipole moment of the third mode, $M_z$, is orthogonal to the metasurface plane. As shown in FIG. 1D, the electric field component $E_y$ in its corresponding field distribution is even with respect to the plane.

Although the cubic resonator supports MD modes of both symmetries, the MD mode $M_z$ does not couple to a plane wave whose propagation vector k (the "k-vector") is directed normal to the xy-plane. Such a mode is said to be "dark". Only the modes with odd symmetry, i.e. the $M_x$ and $M_y$ modes, can be directly excited by this plane wave. Hence, theoretically perfect absorption using only MD modes in cubic dielectric resonators is impossible if the dielectric resonators are perfect cubes.

By breaking the resonator cubic symmetry, however, we have succeeded in concurrently exciting an MD mode with odd symmetry and an MD mode with even symmetry. More specifically, we excite the modes $M_x$ and $M_z$ in our example implementation. That allows us to realize theoretically perfect absorption.

To enable a y-polarized plane wave to excite the dark MD mode $M_z$, we added a continuous bar along one side of each resonator. That arrangement is shown in the far right panel of FIG. 1D. The bar breaks the cubic symmetry and leads to excitation of the otherwise dark mode.

The incident plane wave also excites the $M_x$ mode, and thus both odd and even MD modes are excited simultaneously in such a resonator. At the same time, the bar allows photoexcited charge carriers to flow along the y-axis to neighboring resonators, making the metasurface electrically conductive, as will be understood from examination of FIG. 1A.

In an initial study to confirm the feasibility of using a y-polarized plane wave to excite the two MD modes, we simulated an infinite array of the resonators by FDTD. FIG. 1B provides the dimensions of a single unit cell of the infinite resonator array.

First, we simulated a symmetric metasurface consisting of an array of GaAs resonators placed in a uniform dielectric medium, so that the metasurface had mirror symmetry relative to the xy-plane. We used the refractive index of optical epoxy (n=1.57) to emulate the metasurface substrate. We subsequently determined that a practical implementation of this metasurface, where air (n=1) replaces the epoxy for the half-space x>0 and thus breaks the mirror symmetry, performs similarly due to the relatively high refractive index of the GaAs resonator (n=3.68) compared to the optical epoxy substrate (n=1.57) and the air (n=1) environment.

We determined optimal dimensions of the resonator by monitoring absorption in the structure. That is, theoretically perfect absorption requires that the resonant frequencies for $M_x$ and $M_z$ be aligned, and it requires that the condition of critical coupling be satisfied for the two modes simultaneously. The dimensions summarized in FIG. 1B were found to enable theoretically perfect absorption at optical vacuum wavelength $\lambda$=800 nm for a GaAs metasurface 200 nm thick.

In FIG. 2A, we illustrate using graphics produced from numerical simulations that indeed, the two modes $M_x$ and $M_z$ are both excited by the plane wave impinging on the metasurface at normal incidence. The magnitude |H| and components $H_x$ and $H_z$ clearly show similar magnitudes for the two modes. For comparison, we also show, in FIG. 2B, the field distributions for a cubic resonator (i.e., a rectangle without the side bar) where the MD mode n is not excited, whereas excitation of $M_x$ still occurs. In both cases, the $H_y$ component is negligible, and it is therefore not shown.

The concurrent excitation of the MD mode $M_z$ with the MD mode $M_x$ in the resonator with broken symmetry has a striking effect on the absorption spectrum. As shown in FIG. 2C, nearly perfect absorption occurs within a relatively narrow absorption band for bar widths between 40 nm and 70 nm. This perfect absorption is possible only for y-polarized light, whereas the orthogonal polarization (i.e., x-polarization) is not absorbed by the metasurface as efficiently.

The polarization dependence is consistent with the fact that the x-polarized plane wave excites only one MD mode, namely $M_y$, and it does not excite M.

FIG. 2D is taken from a color map of the absorption spectrum for an array of symmetrical rectangular blocks; it has been included for comparison. In the figure, we have varied the width of the block (along the x-axis), to facilitate comparison with FIG. 2C. Weak absorption, when only a single mode is excited, is evident in the figure. That is, only the MD mode $M_x$ is excited in the symmetrical rectangular block. As a result, only a weak absorption band near the band edge of GaAs (around 730-760 nm) is visible in the map.

Our simulation results confirm that we enable theoretically perfect absorption for y-polarized light at normal incidence by breaking the symmetry of cubic resonators, which leads to simultaneous excitation of the MD modes $M_z$ and $M_x$.

We then simulated absorption in a more realistic version of our metasurface design, in which the metasurface is bounded on one side by air (n=1), and on the other side by the substrate (n=1.57). Our simulations confirmed numerically that with an air interface, the metasurface still exhibited behavior similar to that described above.

In FIG. 3A, we show calculated spectra of the reflectivity R (curve 300), transmission T (curve 305), and absorption A (curve 310) of y-polarized light at normal incidence on the structure with the dimensions given by FIG. 1B. FIG. 3B shows calculated spectra of the reflectivity R (curve 320), transmission T (curve 325), and absorption A (curve 330) of x-polarized light. Consistent with FIG. 2C, the absorption spectrum of FIG. 3A exhibits a strong absorption peak reaching 98% at 799 nm.

It is useful to put these results in perspective and compare the maximum absorption of the metasurface to that of unstructured GaAs layers: A uniform 200-nm-thick GaAs film absorbs less than 30% of incident photons at 800 nm (FIG. 3A, curve 315), whereas an infinitely thick layer of GaAs absorbs ~70%, the latter being limited due to Fresnel reflection from the air—GaAs interface. Therefore, our metasurface enables higher absorption than can be achieved with unstructured GaAs of any thickness.

Using the simulation results, we selected optimal resonator dimensions (FIG. 1B) to achieve maximum absorption at 800 nm, which is a typical wavelength for ultrafast Ti:sapphire lasers. We fabricated metasurfaces to those dimensions and tested their performance experimentally. We characterized the wavelength-dependent transmission and absorption properties of several metasurface samples, one of which is illustrated in FIG. 4A. We found their transmission properties to be similar to the simulations.

Representative normalized transmission spectra of the metasurface of FIG. 4A are shown in FIGS. 4B and 4C. FIG. 4B shows the experimental spectrum 400 and the simulated spectrum 405 for y-polarized light. FIG. 4C shows the experimental spectrum 410 and the simulated spectrum 415 for x-polarized light.

The transmission spectra show reasonable agreement with the numerical results of FIGS. 3A and 3B. In particular, transmission decreases below 5% near 820 nm, indicating efficient resonant absorption for the y-polarized light, whereas the decrease is not as strong for the orthogonal polarization.

The spectra also show some differences: The minimum transmission occurs at 820 nm rather than at 800 nm, and the linewidth of the resonance for y-polarized excitation is broader than in the numerical simulations. We attribute the difference between the simulations and experimental observations to the following three factors: Inhomogeneous broadening due to resonator size variations in the array, a larger average size of the fabricated resonators compared to the design, and the presence of in-plane k-vector components in the focused beam. As seen in FIG. 4A, for example, the resonator size variations are visible in electron micrographs of the array.

The second of the above factors, that is, a larger average size of resonators, is difficult to confirm experimentally due to the limited resolution in the micrograph images. However, we note that the resonance wavelength scales with resonator size, hence it would be reasonable to expect a wavelength shift of 20 nm for a relatively small increase of 2-3% in the resonator size.

The probe beam was focused for the purpose of experimentally characterizing the transmission. The third factor listed above is the presence of in-plane k-vector components in the focused beam. Evaluating this factor required us to look in more detail at the effect of focusing. Unlike the plane wave used in simulations, the optical beam was focused to a spot less than 10 µm in diameter. The focused beam consequently had k-vector components in the xy-plane, which could excite the dark mode $M_z$ directly.

To quantify the effect of focused beam excitation, we simulated transmission properties of the entire metasurface using a focused Gaussian beam illumination. Curves 405 and 415, in FIGS. 4B and 4C respectively, represent results of those simulations.

The simulations confirmed the differences we observed experimentally: The absorption spectrum broadens and the maximum absorption is reduced to 80%.

As expected, the orthogonal polarization (i.e., the x-polarization) is seen to experience weaker absorption as it passes though the metasurface. Although it was difficult to evaluate absorption directly in the experiment, we measured photoconductivity for a wavelength range between 750 and 820 nm. The results are plotted as sequences 420 and 425 of data points in FIGS. 4B and 4C, respectively. We found that excitation with a y-polarized focused laser beam raised the photoconductivity of the metasurface by approximately one half, relative to the x-polarized excitation.

We integrated the metasurface 500 between gold electrodes 505 of a terahertz photoconductive (PC) antenna, as shown in the SEM micrograph of FIGS. 4D and 5A. We tested the performance of the resulting metasurface terahertz detector using a terahertz time-domain spectroscopy (TDS) system. We detected time-domain waveforms of THz pulses generated in a ZnTe crystal. FIG. 5B shows an example pulse waveform measured using y-polarized optical gating pulses of average power of 100 µW.

The metasurface detector produced a noticeably higher photocurrent output compared to conventional terahertz detectors, for an average y-polarized excitation power $P_g$ of only 100 µW.

Even at this low level of excitation, we observed an onset of absorption saturation. In FIG. 5C, data-point sequence 510 is a plot of the terahertz-field-induced peak photocurrent as a function of average power of the optical excitation beam. The saturation effect is evident in plotted curve.

In the same figure, data-point sequence 515 a plot of the root-mean squared (RMS) noise of the photocurrent measured at a frequency of 2.7 kHz, which is a typical modulation frequency used for lock-in photocurrent detection. As is evident in the figure, the noise increases linearly at higher optical excitation powers (>100 µW). We accordingly attribute the main noise source to fluctuations of the laser power.

We found a maximum signal-to-noise ratio (SNR) at $P_g=100$ µW, which is approximately one order of magnitude lower than what is observed for similar terahertz photoconductive (THz PC) detectors without the metasurface.

It is worth noting here that the metasurface detectors exhibit very high dark resistance (~50 GΩ) in comparison to detectors based on unstructured LT GaAs layers (~1 GΩ). The higher resistance leads to a higher ON/OFF switching contrast (>107) and better SNR at low optical excitation powers. The low optical excitation power required for the optimum SNR performance is thus due, according to our current belief, to the efficient optical absorption as well as the high dark resistance of the metasurface.

We note that because the optical fields oscillate within the resonators before being absorbed, the THz detection bandwidth could be limited. Coupling to the $M_z$ magnetic dipole mode, in particular, could potentially limit the detector frequency response, because that mode has a higher Q-factor than the uncoupled $M_x$ mode. On the other hand, however, the Fourier transform of the measured terahertz pulse waveform (see FIG. 5D) shows that the detector sensitivity range reached a relatively high frequency of about 3 THz, at which point the measured signal became comparable to the noise level. This is a typical frequency response for photoconductive THz detectors, indicating that bandwidth degradation for the metasurface detector was negligible.

Notwithstanding, we evaluated the effect of the optical field evolution on the bandwidth of the detector by experimentally comparing the terahertz response for the y-polarized excitation with the terahertz response for the x-polarized excitation. With y-polarization, the MD mode $M_z$ is excited together with $M_x$, whereas for x-polarized excitation, only the MD mode $M_x$ is excited. Therefore, the photocurrent rise time is longer for y-polarized excitation than for x-polarized excitation.

In FIG. 5D, curve 520 is a plot of the Fourier transform spectrum of the terahertz pulse detected using y-polarized optical excitation. Curve 525 is a plot of the Fourier transform spectrum detected in the same device, using x-polarized excitation. Comparison of the two curves shows that at low frequencies, the photocurrent power spectral density (PSD) is higher for y-polarized excitation, confirming that there is more efficient optical absorption in the metasurface.

That enhancement decreases at higher frequencies, and above 2.5 THz the response of the THz detector actually becomes stronger for x-polarized excitation. This indicates that the higher Q-factor of the coupled modes indeed limited the detector performance, albeit only above that frequency.

The inset to FIG. 5D further elucidates the bandwidth-limiting effect by showing the PSD ratio for the two polarizations. We verified that this effect is independent of the shape of the terahertz pulse by using two different crystals to generate the pulses. In the figure inset, curve 530 represents the measured PSD ratio for pulses generated by an indium arsenide (InAs) crystal, and curve 535 represents the measured PSD ratio for pulses generated by a zinc telluride (ZnTe) crystal. As seen in the figure, the two crystals yielded a similar frequency dependence for the PSD ratio.

Other factors affecting the terahertz detector bandwidth include the incident optical pulse duration and the photoexcited charge-carrier recombination time. The recombination time is believed to be the most significant bandwidth limiting factor, because it is several times longer than the evolution of the optical field in the metasurface. However, it is also noteworthy that even a relatively small 50-fs increase in the photocurrent rise time due to the high Q-factor of the coupled modes can still produce a measurable effect on the bandwidth of the THz detector, consistent with the observed polarization dependence.

In summary, we developed a theoretically perfectly absorbing photoconductive all-dielectric metasurface, which can improve the efficiency and performance of ultrafast photoconductive switches. We integrated this metasurface into photoconductive THz detectors and achieved THz pulse detection with SNR of more than six orders of magnitude using an unprecedentedly low level of ultrafast laser excitation of 100 µW. We attribute the extremely low switching power and excellent noise performance to perfect-absorption properties of the metasurface as well as its nanostructure, which results in extremely high dark resistivity.

We realized theoretically perfect absorption, without incorporating any metallic structures or back reflectors, by designing a GaAs resonator which supports two degenerate and critically coupled MD modes. One of the modes has the MD moment normal to the surface, and the second mode has the MD moment in the metasurface plane. Simultaneous excitation of these two modes leads to theoretically close-to-perfect optical absorption near the wavelength of λ=800 nm for a 200-nm-thick photoconductive resonator network.

The resonator network also enables ultrafast and efficient switching of electrical conductivity with high contrast ratio. The photoconductive metasurface is compatible with practical devices, such as THz emitters, detectors, and modulators, and it opens paths for improving their efficiencies and thus impacting practical applications of terahertz technology, including terahertz spectroscopy and imaging and future terahertz communications.

It will be understood that in the preceding discussion, we described an implementation based on magnetic dipole modes of Mie resonators of cubic geometry, fabricated in gallium arsenide. However, the underlying principles are also applicable to other geometries, to other material systems, and to other optical modes.

Thus, for example, these principles can potentially be applied to metasurfaces fabricated in other semiconductors, provided they have low carrier lifetimes. Examples may include radiation damaged silicon, and III-V semiconductors that have been modified by radiation damage or by using special growth techniques to limit the carrier lifetime. Any pairs of Mie modes may be suitable for excitation, provided they are degenerate in frequency, opposite in symmetry, and critically coupled. Alternative geometries may be employed, provided they support suitable pairs of Mie modes. All of these alternative arrangements and material choices should be understood as falling within the scope of the present invention.

EXAMPLES

Experimental Methods 1: Photoconductive Metasurface Fabrication

A 200-nm-thick layer of GaAs was grown at 250° C. by molecular beam epitaxy on top of a semi-insulating GaAs substrate with a GaAs buffer layer and two thin layers of $Al_{0.55}Ga_{0.45}As$ separated by 100 nm. The Al-containing layers serve in the fabrication process as stop-etch layers in a manner that is described below.

The epilayer was then annealed at 600° C. for 40 s in forming gas to achieve high dark resistivity of the material. PC metasurfaces with the pattern shown in FIG. 1B were fabricated using electron beam lithography (EBL) and a hard $SiO_2$ mask. First, the epilayer surface was spin-coated with two layers of photoresist (PMMA495A4/PMMA950A4). The dual photoresist layer facilitates the lift-off process. Patches (20×20 $\mu m^2$) of the pattern in FIG. 1B, repeated with a periodicity of 385 nm, were exposed using a 30-keV electron beam. After optimizing the electron-beam lithography (EBL) dosage, we used a dosage of 240 $\mu C/cm^2$ to produce close replicas of the write pattern.

The photoresist was developed in a solution of methyl isobutyl ketone/isopropyl alcohol (MIBK/IPA) (1:3) for 60 s and then rinsed in isopropyl alcohol (IPA) for 20 s.

We then deposited a 30-nm-thick layer of $SiO_2$ using electron beam evaporation in vacuum. The photoresist was removed by soaking the samples in acetone to form the hard $SiO_2$ mask on the GaAs surface.

We then etched the samples with the $SiO_2$ mask in the $BCl_3$ inductively coupled plasma (ICP) reactive ion etching (RIE) system to the depth of ~200 nm. Gas flow rates into the ICP chamber for $BCl_3$, Ar, and $N_2$ are 20, 2.5, and 4 $cm^3$/min, respectively, and the RF power applied to the sample chuck is 240 W. This RIE process produced practically vertical sidewalls for the etched structure.

After the etch, the remaining $SiO_2$ mask was removed using a buffered oxide wet etch. The etch also removed the passivation layer, which tends to form on the sidewalls during the ME process.

We note that the EBL dosage affected the shape of the etched features. Specifically, exposures lower than 240 $\mu C/cm^2$ made the width of the strip uneven, wider near the cubes and narrower between the cubes; exposures higher than 240 $\mu C/cm^2$ introduced some rounding of the structure corners. After SEM inspection of metasurfaces fabricated using a range of exposures, we selected samples with dimensions closest to the nominal for fabrication of the THz detectors.

Experimental Methods 2: THz Detector Fabrication

Photoconductive THz detectors were built by integrating a terahertz antenna directly over the metasurface. Two metallic bars in the shape of a dipole antenna were lithographically formed using EBL and metal electron beam evaporation. A 3-$\mu m$ gap between pointed tips of the antenna was positioned at the center of the metasurface patch, as shown in FIG. 5A. The width of the pointed tips was 3 $\mu m$, so that a 3 $\mu m$×3 $\mu m$ square area of the metasurface between the bars was accessible for photoexcitation. The antenna bars were 200 nm thick and 10 $\mu m$ wide, and the total length of the entire antenna was ~83 $\mu m$.

The samples with THz detectors were attached to 0.5 mm thick z-cut sapphire substrates using epoxy (EPO-TEC 353ND), with the terahertz antenna surface facing the sapphire substrate. The epoxy thickness was ~2 After curing the epoxy, the GaAs substrate was thinned by mechanical lapping to a thickness of ~20 The remainder of the substrate was then removed using wet etching in a solution of citric acid and hydrogen peroxide. The etch rate for AlGaAs in the citric acid etch was significantly slower than that for GaAs. The Al-containing layers introduced during the growth thus allowed us to stop the wet etch process when the low temperature GaAs metasurface was reached.

The final sample thus contained a terahertz antenna with the photoconductive metasurface in the gap, all bonded to the sapphire substrate by the epoxy.

Experimental Methods 3: Optical Transmission Measurements

To characterize optical transmission of the metasurface samples, broadband light from an incandescent lamp was passed through a broadband polarizer and focused on the metasurface using a microscope objective (50×, NA=0.65). The beam size was estimated to be <10 $\mu m$ in diameter. The transmitted beam was collected by another microscope objective with NA=0.3, passed through another polarizer, and analyzed by a diffraction grating spectrometer.

The transmission spectrum was calculated as a ratio between the spectrum measured for light passing through the metasurface and a spectrum measured for light passing through the sapphire substrate. By using the sapphire substrate as a reference, we could ensure that the optical path in the confocal system would remain the same for both the sample measurements and the reference measurements. Absorption within the sapphire and the thin layer of epoxy was small in the range of interest (650-950 nm), and thus could be neglected.

Experimental Methods 4: Dark Conductivity and Photoconductivity Measurements Dark resistance of the THz PC metasurface detectors was evaluated from I-V characteristics measured with a semiconductor parameter analyzer. Electric current between the antenna contacts was measured in a dark chamber with the bias varied from 0 to 50 mV in steps of 0.01 mV. We found the I-V characteristics linear with the slope corresponding to R~50 G$\Omega$.

Photoconductivity was evaluated for the THz detectors excited by ~160-200 fs pulses generated by a Ti: sapphire laser with the repetition rate of 80 MHz and the average power of 0.2 mW. The intensity and polarization of the excitation pulses were controlled with a λ/2 waveplate and a broadband polarizer (extinction ratio: 500:1). The laser beam was focused in the antenna gap using an NA=0.5 microscope objective (New Focus 20×). Position of the beam in the gap was optimized to achieve minimum resistance, which was measured by a multimeter. The resistance measurements were repeated as the wavelength of the laser was tuned within the tuning range of the laser (750-820 nm). During this set of measurements, we maintained the FWHM of the laser pulse spectrum at ~6-7 nm and the average optical power incident on the THz detector at 0.2 mW.

Experimental Methods 5: Terahertz Pulse
Waveform Measurements

Terahertz detectors were tested using two custom-built terahertz time-domain spectroscopy (TDS) systems driven by Ti:sapphire lasers. In one system, ~160 fs pulses with the central wavelength of 800 nm were used for photoexcitation and gating of the THz detectors, and a ZnTe crystal was used for generation of terahertz pulses. In the other system, ~70 fs optical pulses with the central wavelength of 800 nm were used for excitation and gating of the THz detector, and an InAs epilayer was used for generation of terahertz pulses. In both systems, the polarization of the optical excitation pulses incident on the THz detector was controlled by a λ/2 waveplate and a broadband polarizer (extinction ratio: 500: 1). The terahertz beam was intensity modulated at 2.7 kHz using an optical chopper. The photocurrent from the THz detector was measured by a low-noise current amplifier (DL Instruments) and a lock-in amplifier.

We claim:

1. Apparatus for providing a photoconductive response to optical excitation, comprising:
   an all-dielectric metasurface disposed on a substrate surface; and
   an electrode arrangement electrically connected to the all-dielectric metasurface, wherein:
   the all-dielectric metasurface comprises an array of dielectric Mie resonators;
   the Mie resonators incorporate features that collectively interconnect the Mie resonators in a network that carries electric current when in operation; and
   the features that collectively interconnect the Mie resonators have a configuration that prevents the Mie resonators in which they are incorporated from having more than one symmetry plane normal to the substrate surface.

2. The apparatus of claim 1, wherein the features that collectively interconnect the Mie resonators are bars that connect pluralities of the Mie resonators in rows.

3. The apparatus of claim 1, wherein the electrode arrangement comprises a terahertz antenna.

4. The apparatus of claim 1, wherein the electrode arrangement comprises a terahertz antenna constituted by two metal bars in a dipole configuration.

5. The apparatus of claim 1, wherein the metasurface has a composition comprising gallium arsenide.

6. The apparatus of claim 1, wherein the metasurface comprises an epitaxial layer of gallium arsenide grown on a gallium arsenide substrate.

7. The apparatus of claim 1, wherein each of the Mie resonators is conformed to support two magnetic dipole modes that are degenerate in frequency.

8. The apparatus of claim 1, wherein each of the Mie resonators is conformed to support two optical modes that are degenerate in frequency and that are opposite in symmetry.

9. The apparatus of claim 1, wherein the metasurface is optically thin and is not underlain by any metallic structures.

10. The apparatus of claim 1, conformed as a switch.

11. The apparatus of claim 1, conformed as an optical detector.

* * * * *